US006192028B1

(12) United States Patent
Simmons et al.

(10) Patent No.: US 6,192,028 B1
(45) Date of Patent: Feb. 20, 2001

(54) METHOD AND APPARATUS PROVIDING PROGRAMMABLE THRESHOLDS FOR HALF-DUPLEX FLOW CONTROL IN A NETWORK SWITCH

(75) Inventors: Philip Simmons, San Jose; Bahadir Erimli, Mountain View; Jinqlih Sang, Fremont; Eric Tsin-Ho Leung, Sunnydale; Ian Crayford, San Jose; Jayant Kadambi, Milpitas; Denise Kerstein, Mountain View; Thomas Jefferson Runaldue, San Jose, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 08/992,848

(22) Filed: Dec. 18, 1997

Related U.S. Application Data

(60) Provisional application No. 60/038,025, filed on Feb. 14, 1997.

(51) Int. Cl.[7] .................................................. H04L 12/56
(52) U.S. Cl. ........................ 370/229; 370/282; 370/296; 370/417
(58) Field of Search .................................... 370/229, 230, 370/231, 235, 236, 278, 282, 296, 417

(56) References Cited

U.S. PATENT DOCUMENTS 5,515,376  5/1996  Murthy et al. ........................ 370/428

FOREIGN PATENT DOCUMENTS

| 0748087A1 | 12/1996 | (EP) | ........................ H04L/12/56 |
| 07066845 | 3/1995 | (JP) | ........................ H04L/12/28 |
| WO 96/41456 | 12/1996 | (WO) | ........................ H04L/12/56 |

Primary Examiner—Chi H. Pham
Assistant Examiner—Maikhanh Tran

(57) ABSTRACT

A network switch having a shared memory architecture for storing data frames has a set of programmable thresholds that specify when flow control should be initiated on a selected network port. The network switch includes a queue for storing free frame pointers, each specifying available memory locations in an external memory for storing data frames received from a network station. The network switch takes a frame pointer from a free buffer queue for each received data frame, and stores the received data frame in the location in external memory specified by the frame pointer while a decision making engine within the switch determines the appropriate destination ports. Flow control is initiated on a half-duplex network port by transmitting a phantom packet to a transmitting network station if the output buffer of a destination port exceeds a programmed high threshold, or if the output buffer of the destination port exceeds a low programmed threshold and the queue of free frame pointers falls below a low programmable threshold. The switch thus provides flexibility in providing selective collisions with transmitting stations to minimize the possibility of network congestion without wasting network bandwidth with unnecessary collisions.

18 Claims, 10 Drawing Sheets

METHOD AND APPARATUS PROVIDING PROGRAMMABLE THRESHOLDS FOR HALF-DUPLEX FLOW CONTROL IN A NETWORK SWITCH

RELATED APPLICATIONS

This application claims priority from provisional patent application Ser. No. 60/038,025, filed Feb. 14, 1997, entitled INTEGRATED MULTIPORT SWITCH, which is incorporated herein by reference.

BACKGROUND OF THE INVENTION

1. Technical Field

The present invention relates to network switching and more particularly, to methods and systems controlling network data traffic on half-duplex media in switched networks.

2. Background Art

Switched local area networks use a network switch for supplying data frames between network stations, where each network station is connected to the network switch by a media. The switched local area network architecture uses a media access control (MAC) layer enabling a network interface card to access the media. The network switch passes data frames received from a transmitting station to a destination station based on the header information in the received data frame.

Network congestion occurs if a receiving network element, for example a receiving network station, is unable to receive data at a rate greater than or equal to the transmission rate of the transmitting element. For example, traffic in a client-server environment is dominated by client requests followed by a burst of frames from the server to the requesting client. Hence, only a limited number of client requests can be output to the server from the switched hub at the assigned switching port. If the number of client requests exceeds the capacity of the server's port, some of the data packets will be lost. In another example, a client having limited buffer space may be unable to keep up with the transmission rate of a transmitting station, resulting in lost packets. Finally, network congestion may occur if a transmitting station attempts to transmit data packets to a receiving station that is already receiving data packets from another transmitting station. Hence, a receiving station may be unable to keep up with reception of data packets from two separate transmitting stations.

Flow control has been proposed to reduce network congestion, where a sending station temporarily suspends transmission of data packets. A proposed flow control arrangement for a half-duplex environment, referred to as "back-pressure," causes a receiving station to force a collision with the transmitting station when the receive buffer of the receive station reaches a "receive buffer unavailable" state.

The disclosed flow control proposals, however, assume that flow control should be initiated when a receive buffer is full, which still results in a loss of data. Moreover, the existing proposals do not describe how to determine the instance in which flow control should be initiated. The problem also become more complex in a switched environment, where a network switch must route data packets received from a plurality of transmitting stations to the appropriate destination stations. Moreover, if the flow control duration is too short, a receiving station may still lose portions of the transmitted data. If the duration is too long, the transmitting station remains idle, reducing network throughput.

SUMMARY OF THE INVENTION

In view of the foregoing, there is a need for an arrangement in a network switch for selectively outputting data frames from a transmitting station to a destination station that efficiently implements flow control in a manner that avoids dropped data packets and wasted network bandwidth.

There is also a need for an arrangement that selectively generates flow control signals to a transmitting station from a switched network element based on a buffer capacity of an output port serving a destination station, as well as the overall global buffer capacity of the switched element for all network stations.

There is also a need for an arrangement in a switched network element for selectively routing data packets to a destination station, where the destination station can be identified quickly enough to assert back pressure to the transmitting station to halt transmission of the data frame currently being transmitted.

These and other needs are attained by the present invention, where a network switch selectively transmits a flow control signal to a transmitting station during reception of a data frame based upon a number of free frame pointers stored in a queue relative to an adjustable queue, where the free frame pointers specify respective memory locations available for storing received data frames, and an adjustable queue threshold relative to the queue storing the free frame pointers.

According to one aspect of the present invention, a method in a network having network stations includes the steps of setting a first queue threshold level for a first queue configured for storing free frame pointers, the free frame pointers specifying respective memory locations available for storing received data frames, receiving a portion of a first data frame from a first of the networks stations, and selectively transmitting a signal to the first network station during reception of the first data frame based on the first queue threshold level and a number of the free frame pointers stored in the first queue, the signal causing a collision with the first network station during transmission of the first data frame. The transmission of the signal to the first network station during reception of the first data frame that causes the collision ensures that network throughput is maximized, since the transmitting station is immediately halted from continued transmission of the first data frame. Moreover, the decision to transmit the signal to the first network station to cause a collision is based upon a number of free frame pointers stored in the queue, where the free frame pointers specify respective memory locations in a global buffer pool available for storing received data frames. Hence, the present invention provides a particularly advantageous arrangement of managing global buffer capacity by providing a memory architecture where memory allocation is based on free frame pointers that specify memory locations available for storing received data frames.

Another particular feature of the above-described aspect includes the steps of setting a second queue threshold level for a port queue configured to store an assigned frame pointer, the assigned frame pointer specifying a storage memory location of a stored data frame to be transmitted to a second of the network stations, and identifying the port queue as a destination port for the first data frame based on the portion of the first data frame, wherein the selectively transmitting step comprises selectively generating the signal based on the number of free frame pointers relative to the first queue threshold level and a number of the assigned frame pointers relative to the second queue threshold level.

Hence, the decision to selectively transmit a signal to cause a collision can be based upon either the number of free frame pointers for global use by the network switch relative to the first queue threshold, or the number of assigned frame pointers corresponding to an identified destination port relative to the second queue threshold level.

Another aspect of the present invention provides an apparatus for selectively outputting a data frame from a transmitting station to a destination station in a network, comprising a first port for receiving at least a portion of the data frame from the transmitting station, a first queue for storing free frame pointers, the free frame pointers specifying respective memory locations available for storing received data frames, a first programmable threshold register for storing a first threshold value, a second port for outputting data frames identified for transmission to the destination station, and a controller for selectively causing the first output port to induce a collision with the transmitting station during reception of the data frame from the transmitting station, based on a number of the free frame pointers stored in the first queue relative to the first threshold value. The use of free frame pointers provides a flexible memory architecture for the storage and transmission of data frames. Moreover, selective collisions based on the number of free frame pointers stored in the queue ensures that the possibility of network congestion is minimized without wasting network bandwidth with unnecessary collisions.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF ILLUSTRATED EMBODIMENTS

The present invention will be described with the example of a switch in a packet switched network, such as an Ethernet (IEEE 802.3) network. A description will first be given of the switch architecture, followed by the arrangement for regulation network activity according to the present invention. It will become apparent, however, that the present invention is also applicable to other packet switched systems, as described in detail below.

Switch Architecture

Figure 1:
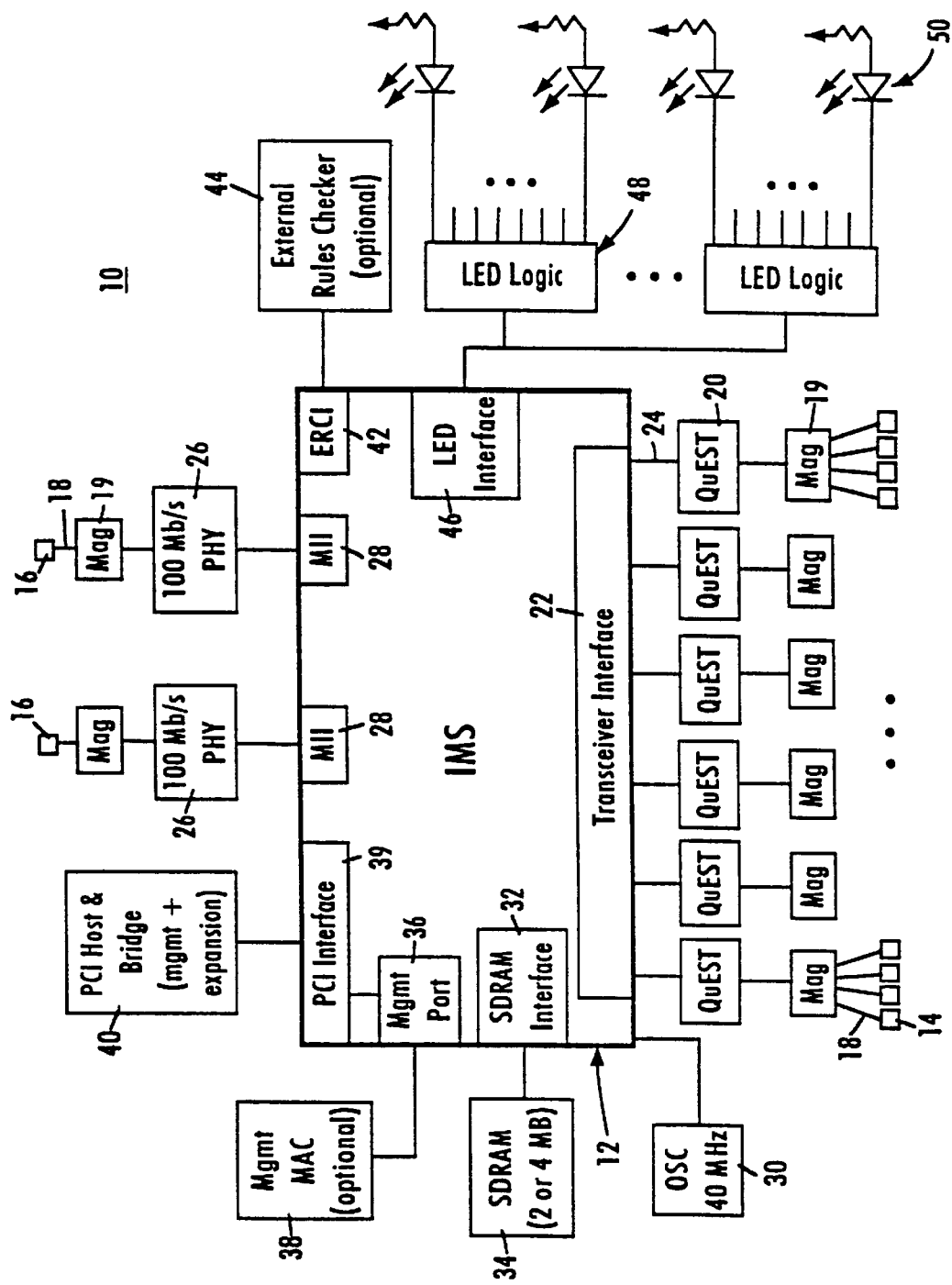
FIG. 1 is a block diagram of a packet switched system constructed in accordance with an embodiment of the present invention.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, where the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 by a management MAC interface 38. The multiport switch 12 also includes a PCI interface 39 enabling access by the management entity via a PCI host and bridge 40. Alternatively, the PCI host and bridge 40 may serve as an expansion bus for a plurality of IMS devices 12.

The multiport switch 12 includes an internal decision making engine that selectively transmits data packets received from one source to at least one destination station. The internal decision making engine may be substituted with an external rules checker. The multiport switch 12 includes an external rules checker interface (ERCI) 42 that allows use of an external rules checker 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 48 provides a 40 MHz clock input for the system functions of the multiport switch 12.

Figure 2A:
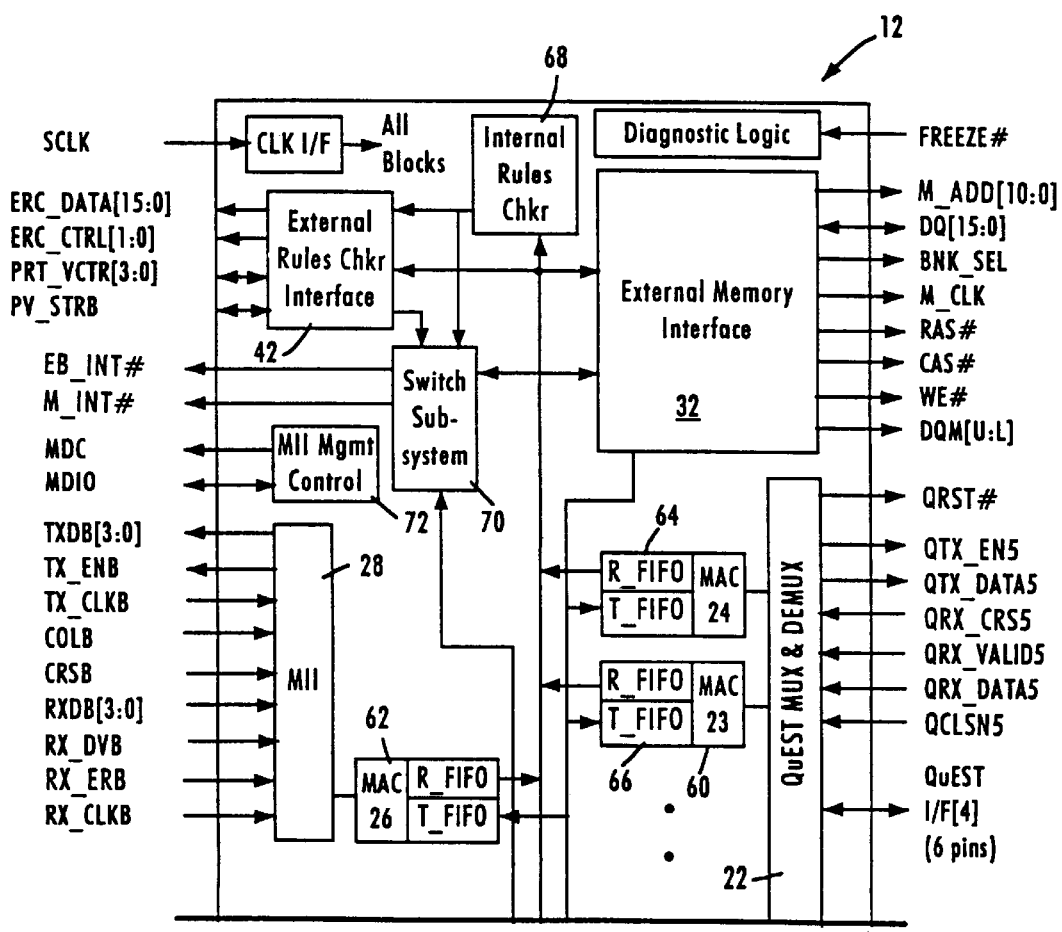
FIG. 2 is a block diagram of a multiport switch constructed in accordance with an embodiment of the present invention and used in the packet switched system of FIG. 1.
Figure 2B:
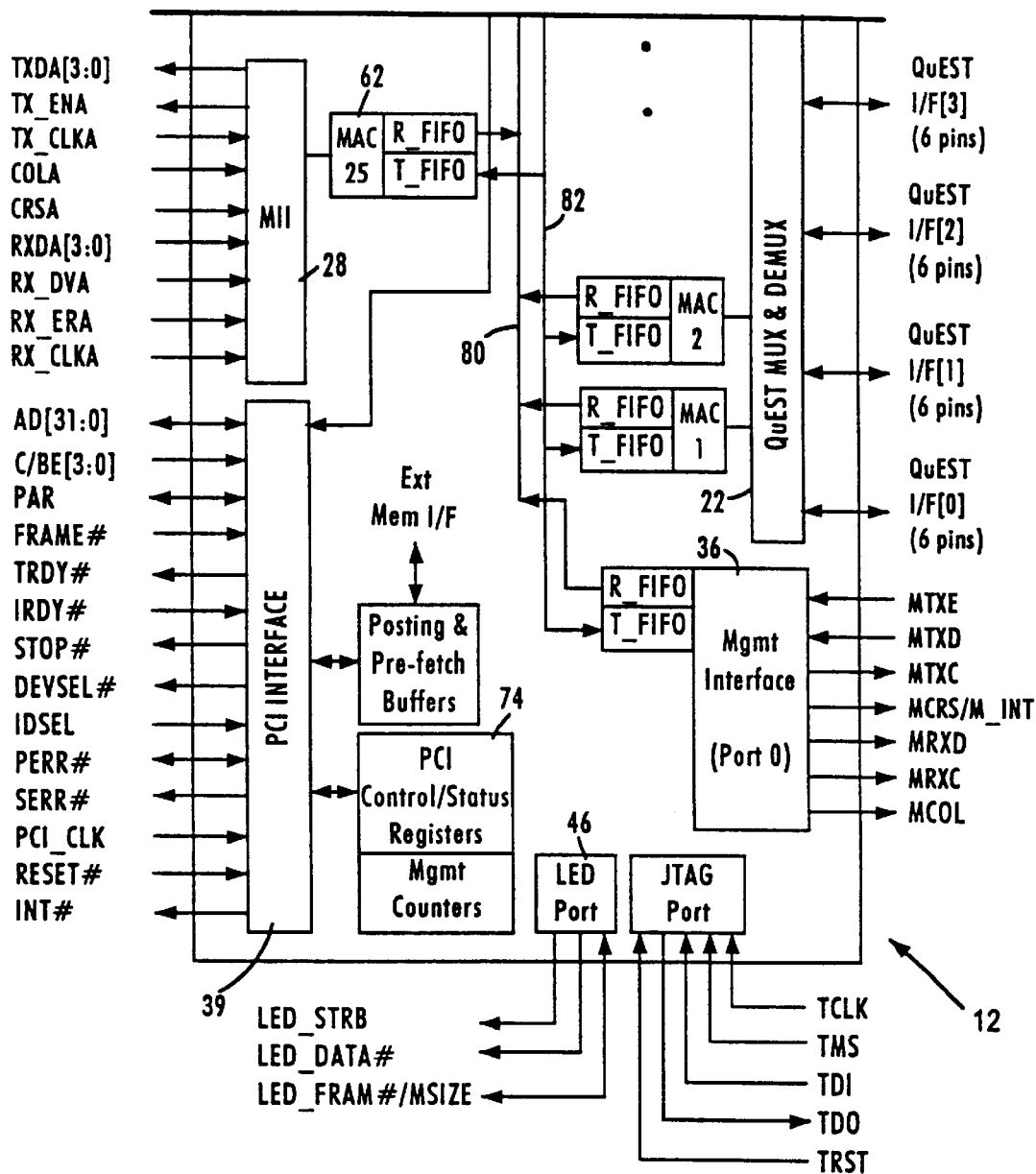

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first in-first out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 32, to determine which MAC ports will output the data packet. Specifically, the packet header is forwarded to an internal rules checker 68 or the external rules checker interface 42, depending on whether the multiport switch 12 is configured to operate using the internal rules checker 68 or the external rules checker 44. The internal rules checker 68 and external rules checker 44 provide the decision making logic for determining the destination MAC port for a given data packet. The decision making engine may thus output a given data packet to either a single port, multiple ports, or all ports (i.e., broadcast). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged frame according to IEEE 802.1d protocol that specifies another network (via a router at one of the 100 Mb/s stations 16) or a prescribed group of stations. Hence, either the internal rules checker 68 or the external rules checker 44 via the interface 42 will decide whether a frame temporarily stored in the buffer memory 34 should be output to a single MAC port or multiple MAC ports.

Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The decision making engine (i.e., internal rules checker 68 or the external rules checker 44) outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u). For example, the management data interface 72 outputs a management data clock (MDC) providing a timing reference on the bidirectional management data 10 (MDIO) signal path.

The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Figure 3:
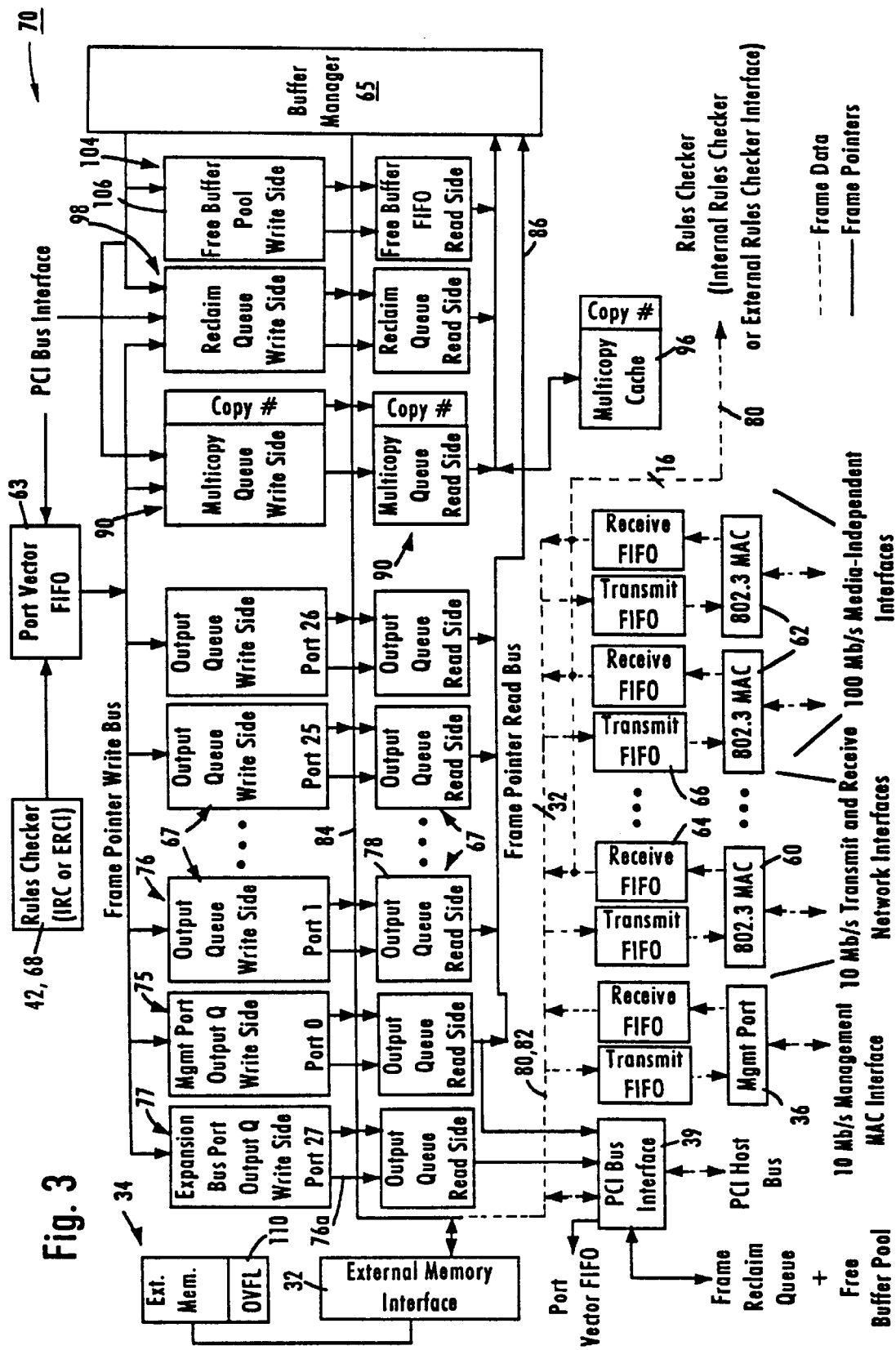
FIG. 3 is a schematic depiction of a switch subsystem of the multiport switch of FIG. 3, constructed in accordance with an embodiment of the present invention.

FIG. 3 depicts the switch subsystem 70 of FIG. 2 according to an exemplary embodiment of the present invention. Other elements of the multiport switch 12 of FIG. 2 are reproduced in FIG. 3 to illustrate the connections of the switch subsystem 70 to these other elements. The switch subsystem 70 contains the core switching engine for receiving and forwarding frames. The main functional blocks used to implement the switching engine include: a port vector FIFO 63, a buffer manager 65, a plurality of port output queues 67, a management port output queue 75, an expansion bus port output queue 77, a free buffer pool 104, a multicopy queue 90, a multicopy cache 96 and a reclaim queue 98. The operation and structure of these functional blocks will be described in more detail, but a brief overview of the switch subsystem 70 of FIG. 3 is first presented to provide context to the later discussion of the individual elements.

There are two basic types of frames that enter the multiport switch 12 from the ports: unicopy frames and multicopy frames. A unicopy frame is a frame that is received at a port which is to be transmitted by the multiport switch 12 to only one other port. By contrast, a multicopy frame is a frame that is received at one port for transmission to more than one port. In FIG. 3, each port is represented by a corresponding MAC 60, 62, or 36 having its own receive FIFO 64 and transmit FIFO 66.

Frames, whether unicopy or multicopy, are received by the internal MAC engines 60, 62, or 36, and placed in the corresponding receive FIFO 64. Each data frame has a header including at least a destination address, a source address, and type/length information. The header is provided to a rules checker (i.e., either the internal rules checker 68 or the external rules checker interface 42). The rules checker, based on the information in the header, determines from where the frame packet will be cast, i.e., through which port or ports will the frame packet be transmitted.

At the same time as the rules checker 42 or 68 is making its forwarding determination, the buffer manager 65 obtains a free frame pointer from the free buffer pool 104. The free frame pointer specifies a location in external memory 36 available for storing the data frame currently stored in the receive FIFO 64. The buffer manager 65 transfers the data frame from the receive FIFO 64 over a data bus 80 (see FIG. 2) to the external memory 34 in a direct memory access (DMA) transaction, and the data frame is stored in the location pointed to by the free frame pointer obtained from the free buffer pool 104.

The buffer manager 65 also sends the free frame pointer to the rules checker 42 or 68 to enable the appropriate rules checker to process the header information while maintaining the storage location of the data frame. This free buffer pointer is now referred to as merely as a frame pointer, since it points to the memory location in the external memory 34 where the frame is stored. The rules checker 42 or 68 makes the forwarding decision, where the rules checker identifies at least one destination port for the data frame stored in the external memory 34 based on the corresponding header information, and generates a forwarding instruction in the form of a "port vector". In the exemplary illustrated embodiment, the port vector is a 28-bit vector with a bit set for each output port identified as a destination port to which the data frame should be forwarded. Assuming that the received frame is a unicopy frame, only one bit corresponding to the one destination port is set in the port vector generated by the rules checker 42 or 68. Hence, the rules checker uses the port vector to assign the frame pointer to at least one destination port.

The rules checker 42 or 68 places the port vector and the corresponding frame pointer (as well as a control opcode and a VLAN index) into the port vector FIFO 63. The port vector is examined by the port vector FIFO 63 to determine into which particular output queue 67 (or queues) the frame pointer associated with the port vector should be input. The port vector FIFO 63 assigns the frame pointer to the appropriate destination port(s) by placing the frame pointer into the top of the appropriate output queue 67, queuing the transmission of the data frame from the corresponding destination port. Hence, the frame pointer becomes an "assigned frame pointer," where it is assigned to a destination port.

At some point in time, the assigned frame pointer reaches the bottom of the output queue 67 after passing through the output queue 67. The buffer manager 65 takes the assigned frame pointer from the bottom of the output queue 67 using a frame pointer read bus 86, fetches the corresponding data frame in a DMA transaction from the location in external memory 36 pointed to by the assigned frame pointer, and places the fetched data frame into the appropriate transmit FIFO 66 via a data bus 82 (see FIG. 2) for transmission by the corresponding MAC layer.

A multicopy transmission is similar to the unicopy transmission, except that the port vector has multiple bits set, designating the multiple destination ports from which the frame will be transmitted. The frame pointer is assigned (i.e., stored in) each of the appropriate output queues 67 and transmitted from the corresponding transmit FIFOs 54.

The buffer manager 65 uses the special control queues, e.g., the free buffer pool 104, the multicopy queue 90, the reclaim queue 98, and the multicopy cache 96 to manage the process of allocating buffers to store received data frames, and retrieving buffers for re-use once the frame has been transmitted to its designated output port(s). The buffer manager 65 also maintains "overflow" regions in external memory 36 for the output queues 67, 75, 77 and the control queues 104, 90 and 98. Specifically, these queues each include a three-part configuration including on-chip and off-chip storage locations. On-chip storage is preferable for high performance, where all of the queuing structure is maintained on the chip (referring to the multiport switch 12). However, the real estate on a chip is very expensive and real estate costs create a problem when the chip is designed to switch, and needs to queue, a large number of entries. The present invention solves this dilemma by providing a single output queue that includes a high performance, low capacity section that is on-chip, and an overflow area that is off-chip, i.e., is implemented on a separate discrete memory chip 34. The overflow area thus allows the queue to serve as a large capacity queue as needed, and is configured within the output queue in a manner that the a relatively lower performance of the off-chip overflow area does not adversely affect the overall performance of the output queue.

Each logical queue 67, 75, 77, 90, 98, and 104 of the present invention includes a write-side queue 76 and a read-side queue 78 located on the chip 12, and an output queue overflow area (generally designated as 110) located in an assigned portion of the external memory 34. Access to the external memory 34 for all of the output queues 67 is through the external memory interface 32, as described earlier. The present invention takes advantage of the bursting nature of current external memories, so that the overflow data (e.g., frame pointers) is sent on and off the chip to the overflow queue area 110 in bursts over the bus 84 to the external memory 34.

The write-side queue 76 and the read-side queue 78 located on the chip 12 are considered to be small, expensive, and high-performance resources. By contrast, the overflow area 110, forming the third part of the output queue 67, provides a large, inexpensive, low-performance, large capacity path.

Each buffer 67, 75, 77, 90, 98, and 104 operates by the corresponding write-side queue 76 receiving the corresponding frame pointer entry at an input end of the write-side queue 76. The frame pointer points to the first buffer location in external memory storing the first 256 bytes of a data frame.

After the entry flows through and reaches the output end at the bottom of the write-side queue 76, control logic associated with the output queue 67 selects whether the entry should be output to the corresponding assigned portion 110 of the external memory 34 or the read-side queue 78. If there is available space in the read-side queue 78, and the overflow area 110 for that output queue 67 is empty, then one or more entries are passed directly from the write-side queue 76 to the read-side queue 78. This passing of the entry or entries directly from the write-side queue 76 to the read-side queue 78 is performed entirely on the chip 12, and thus provides a low-latency, fast flow-through of an entry.

If the read-side queue 78 is full, but there is not yet a burst-size amount of data in the write-side queue 76, then the entry remains in the write-side queue 76. If the read-side queue 78 is full and there is at least a burst-size amount of data (e.g., 16 bytes worth of entries) in the write-side queue 76, then the data is written in a burst fashion by the buffer manager 65 into the overflow area 110 in the corresponding assigned portion of the external memory 34. Eventually, the readside queue 78 will empty, and if there is data in the overflow area 110, the buffer manager 65 will supply a burst of data from the overflow area 110 into the readside queue 78 when the read-side queue 78 has enough space to accommodate the burst-size amount of data. Hence, the read-side queue 78 selectively receives the frame pointer from the write-side queue 76 or the assigned portion 110 of the external memory 34.

Hence if an output queue 67 begins to receive a large number of entries (e.g., frame pointers), these entries can be placed into the overflow area 110 to avoid overflowing the on-chip queue 78, minimizing possibility of discarding frames. The total amount of memory dedicated to the overflow areas 110 may also be readily changed by changing the size of the external memory 36. Furthermore, the sizes of the individual specific overflow areas 110 are programmable to customize the queue sizes, without impacting the performance of the output queues 74.

The multiport switch as depicted in FIGS. 1 and 2 has twenty-eight output queues serving the twenty-four 10 Mb/s user ports 60, the two 100 Mb/s server ports 62, the management port 36, and the expansion bus port 38, respectively. The output queues 67, 75 and 77 provide temporary storage for frame pointers when they are queued for transmission. Queuing takes the form of the port vector FIFO 70 writing frame pointers into the various output queues 67, 75 and 77 indicated in a forwarding port vector.

Figure 5:
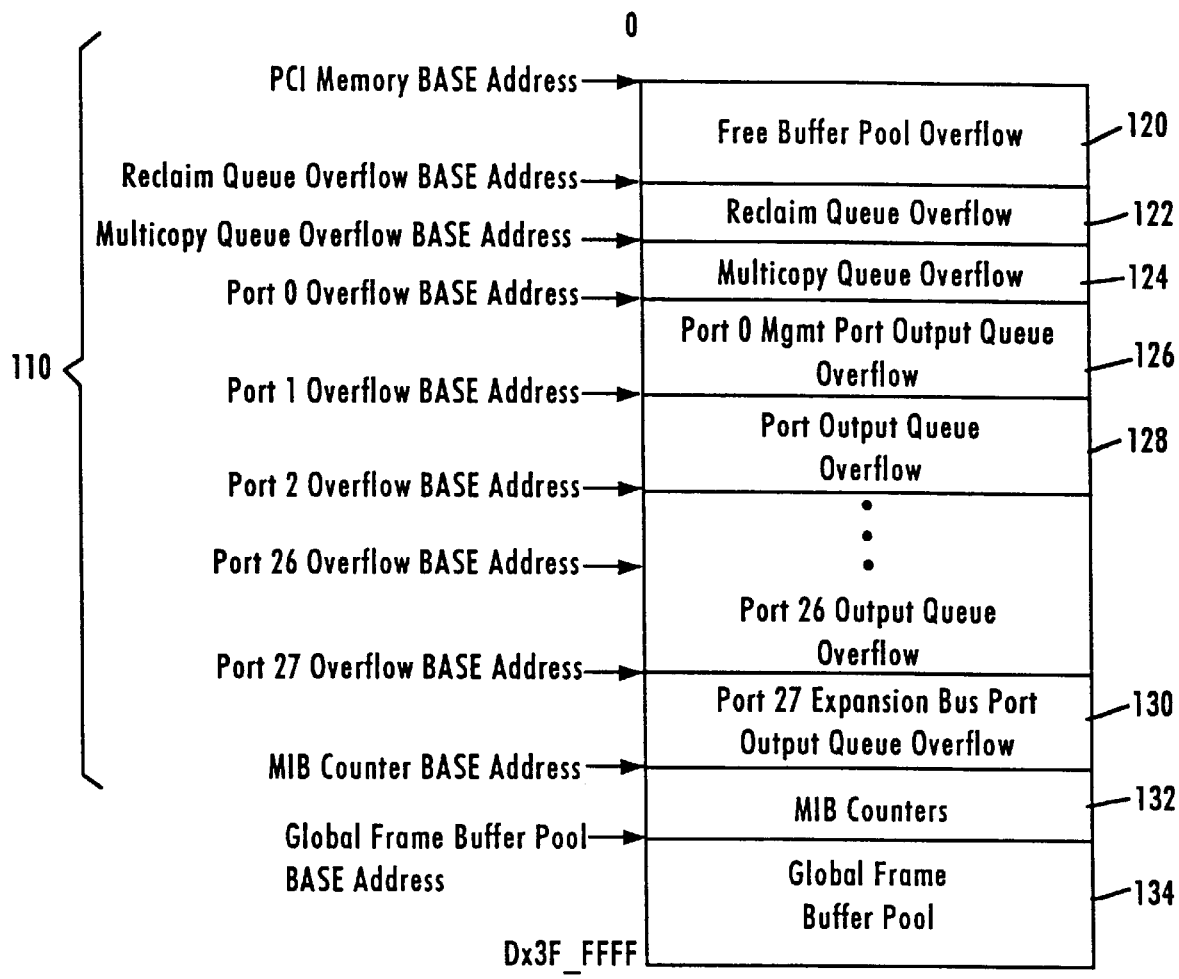
FIG. 5 is a memory map diagram of the external memory of FIG. 1, configured in accordance with an embodiment of the present invention.

FIG. 5 is a diagram illustrating an exemplary map of the external memory 34. The overall capacity of the external memory 34 may be, for example, 4 Mb, although other capacity memories are employed in different embodiments. The use of an external memory 34 for the overflow areas according to the present invention permits increasing or decreasing the size of the output queues by simply changing the external memory. This is an advantage over systems in which the queue structure is entirely on the chip, as the overall queuing capacity is set at manufacture of the chip.

To satisfy the overflow storage requirements of the switch 12, the overflow region 110 of the external memory 34 has assigned memory portions for a free buffer pool overflow 120, a reclaim queue overflow 122, a multicopy queue overflow 124, a management port output queue overflow 126, output queue overflows 128 for each of the 10 Mb/s and 100 Mb/s destination ports (Ports 0–26), and an expansion bus port (Port 27) output queue overflow 130. The memory 34 also includes assigned portions for the MIB counters 132, and the global frame buffer pool 134.

The BASE Address for the entire memory region is programmable in a memory base address register among the registers 74 on the chip. The BASE Address for each area in the external memory map is programmable in the register set. No length register is required, since the length for a given area is equal to the area from that area's BASE Address to the BASE Address of the next adjacent area in the mapping.

Since the length (and therefore capacity) of each of the individual overflow areas is programmable, the overall capacity of each queue is programmable. This feature of the present invention permits customization of the switch to provide particular output queues with increased capacity, as needed.

The overflow areas 110 store excess entries that do not fit into the control queues on the chip 12. For example, the free buffer pool overflow area 120 stores for the free buffer pool 104 the excess free frame pointers identifying the currently unused buffers in the global frame buffer pool 134. The reclaim queue overflow area 122 stores for the reclaim queue 98 excess frame pointers to linked-list chains that are no longer needed. The multicopy queue overflow area 124 stores for the multicopy queue 90 excess frame pointers with copy numbers ">=1" (for queued frame pointers) and frame pointers with copy numbers "−1" (for successfully transmitted frames). The management port output queue overflow area 126 stores for the management port queue 74 excess assigned frame pointers awaiting transmission to the management port 36 (Port 0). Output queue overflow areas 128 store excess assigned frame pointers awaiting transmission to the appropriate 10 Mb/s ports (Ports 1–24) or 100 Mb/s ports (Ports 25–26) for the respective port queues 67. The expansion bus port output queue overflow area 130 for the expansion bus port (Port 27) queue 77 stores frame pointers awaiting transmission to the expansion bus port.

The MIB counter region 132 contains all the per port statistics which are updated periodically by the switch 12. The switch 12 maintains 8-bit and 16-bit counters on-chip for storing MIB statistics. The switch 12 updates the 32-bit or 64-bit MIB counters in external memory 36 with the frequency required to prevent loss of MIB data.

The global frame buffer pool 134 contains buffers in linked-lists which store received frame data. At any given time, these linked lists contain valid frame data, obsolete buffers which will be returned by the buffer manager 72 to the free buffer pool 104, or locations owned by the PCI host processor (not shown).

Regulating Network Activity

The present invention is directed to selectively outputting data frames from a transmitting station to a destination station. The multiport switch 12 uses flow-control to regulate inbound network activity when internal resources deplete to certain user-definable thresholds, described in detail below. Specifically, flow control is initiated when a frame received on a network port is to be supplied to a resource within the multiport switch that has limited capacity, determined by the resource contents passing a prescribed threshold. In the case of a half-duplex port, flow control is initiated when the multiport switch 12 outputs a phantom packet that forces a collision on the receiving port of the transmitting station, also referred to as back-pressure. Flow control is implemented in a full-duplex port, according to the IEEE 802.3x standard, by the generation of MAC control PAUSE frames that inhibit transmission of data frames for a specified period of time. The multiport switch 12 supports back-pressure on all network ports (Ports 0–26) operating in half-duplex mode and generation of PAUSE frames by the 100 Mb/s ports 62. If desired, the 10 Mb/s ports may also be configured to provide full-duplex flow control.

Back-pressure is generated on a half-duplex port by forcing a collision during reception of a specific frame from a transmitting station. As described in detail below, the collision is forced by the multiport switch 12 outputting a phantom packet to the transmitting station within a prescribed interval of receiving a portion of the data frame. Transmission of the phantom frame causes the sending station to abort transmission, jam, and perform the Truncated Binary Exponential Back-off (TBEB) algorithm prior to retransmission. The multiport switch 12 thus has the opportunity to transmit its own data frame to free up the output buffers 67 during the time that the previously transmitting station is deferring according to the TBEB algorithm.

A particular feature of the present invention is that the multiport switch 12 must make a decision quickly (e.g., within one-half slot time) whether to assert a collision with the incoming frame. Hence, back-pressure is used only when the internal rules checker 68 is active. Back-pressure can apply equally to unicast and multicast frames.

Figure 4:
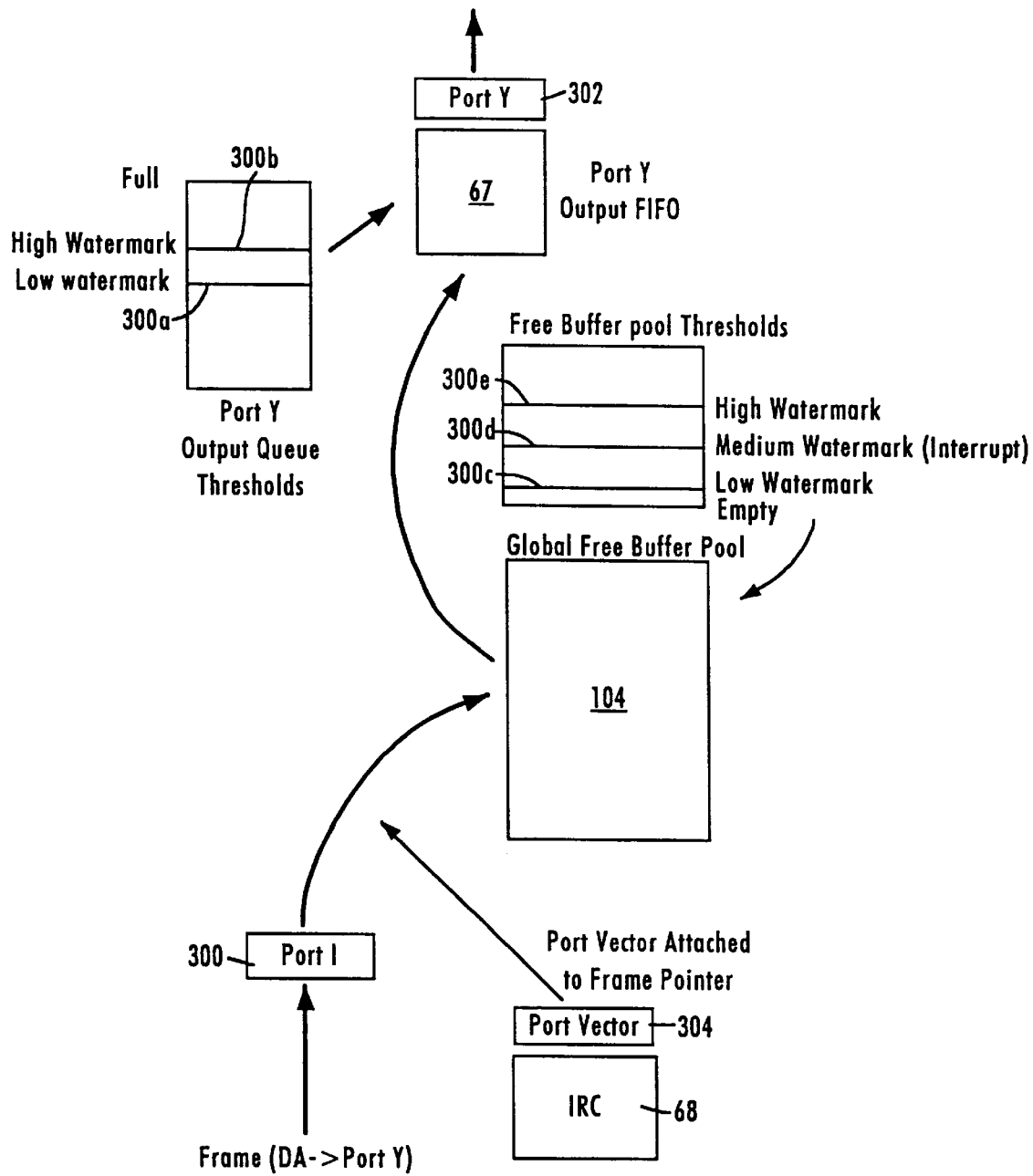
FIG. 4 is a diagram illustrating relationships between buffers and watermark threshold levels in the switch subsystem of FIG. 3 in accordance with an embodiment of the present invention.

FIG. 4 is a diagram illustrating the relationship between watermark threshold levels used to determine whether back-pressure should be applied relative to the associated buffers. As described below, the watermark threshold levels are programmed using an external host processor 40 to selectively cause back-pressure when buffer resources are limited.

Figure 6:
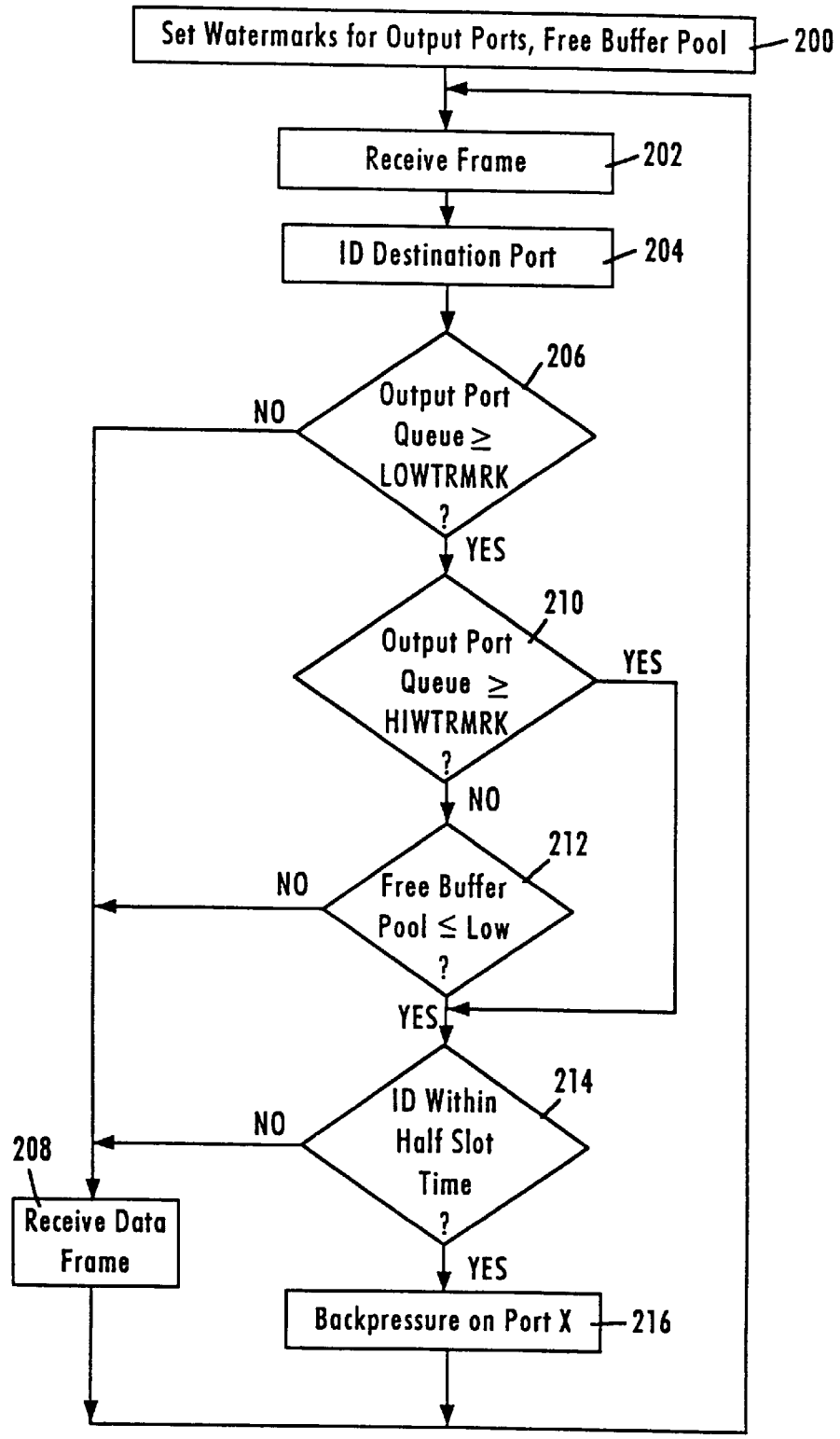
FIG. 6 is a diagram of the method for selectively outputting data frames from a transmitting station to a destination station according to an embodiment of the present invention.

FIG. 6 is a flow diagram illustrating the method of selectively controlling outputting of a data frame from a transmitting station to a destination station according to an embodiment of the present invention. As shown in FIG. 6, the method begins in step 200 by the host processor 40 setting the watermarks 300 for the output ports and the free buffer pool, described in detail below. Once the watermark threshold levels 300 have been set in step 200, the multiport switch 12 begins receiving frames in step 202. Specifically, a receiving port 300 receiving data from a transmitting station, for example port x shown in FIG. 4, begins to receive a data frame from the transmitting station 14 according to Ethernet protocol. As port x 300 begins to receive the data frame in step 202, the first portion of the data frame containing the header is forwarded to the internal rules checker 68. The internal rules checker 68 determines the destination port 302 in step 204, for example port y, and generates the port vector 304 which is supplied to the port vector FIFO 63.

Once the destination port(s) 302 has been identified, the buffer manager 65 determines if the destination port has limited resources with respect to watermarks 300 as set in a port output queue threshold register 226 and/or the free buffer pool threshold register 220, described below with respect to FIG. 7B. Specifically, the method first checks in step 206 if the output queue 67 for port y is filled equal or above the low watermark 300*a*. If the output queue for port y is not above the low watermark 300*a*, the buffer manager 65 allows reception of the entire frame by port x in step 208 without generating a phantom frame. However, if the output queue 67 for port y is filled equal to or above the low watermark 300*a*, the buffer manager 65 then checks in step 210 if the output queue 67 for port y is filled equal to or above the high watermark 300*b*. If the output queue 67 for port y is less than the high watermark 300*b*, then the buffer manager 65 checks in step 212 if the free buffer pool 104 is equal to or below the low watermark 300*c*, indicating a limited number of free space in the global frame buffer pool 134. If in step 212 the free buffer pool is greater than the low watermark 300*c* (i.e., the queue threshold) in step 212, indicating that both the global frame buffer pool 134 (pointed to by the free buffer pool 104) and the output queue 67 have sufficient resources to accept the data frame, then the buffer manager 65 continues to step 208 to continue receiving the incoming data packet without forcing a collision.

However, if in step 212 the free buffer pool 104 is equal to or below the low queue threshold 300*c*, then the method identifies that available resources are limited and that transmission of the incoming frame needs to be halted. Similarly, if in step 210 the output queue 67 for the output port 302 is filled equal to or above the high watermark 300*b*, then the output queue 67 for port y has limited resources, requiring transmission of the incoming frame from port x to be halted.

If the buffer manager 65 determines in steps 210 or 212 that resources are limited, the buffer manager 65 checks in step 214 whether the destination port 302 has been identified within a prescribed interval, for example one-half a slot time in step 214. Specifically, the multiport switch 12 ensures that late collisions with a transmitting station do not occur by limiting the assertion of back-pressure collision only up to one-half a slot time from the point at which the transmitting frame was first received. A slot time equals 512 bit times, which corresponds to 64 byte times or 51.2 microseconds for 10 Mb/s media, and one-half slot time is 25.6 microseconds for 10 Mb/s media. Hence, if the buffer manager 65 determines in step 214 that the internal rules checker 68 was unable to determine the port vector within one-half slot time, then back-pressure will not be asserted. If back-pressure fails, and resources are not available, then the received frame will be dropped. However, if in step 214 the buffer manager 65 determines that the destination port ID was identified within one-half the slot time, then the MAC layer for the receiving port 300 is instructed to cause a collision by outputting a phantom frame to the transmitting station in step 216.

Figure 7A:
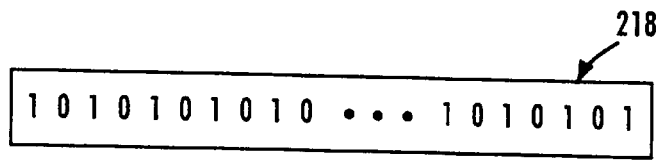
FIGS. 7A and 7B are diagrams illustrating a phantom packet and registers within the multiport switch of FIG. 2 used for the method of FIG. 6, respectively.

FIG. 7A is a diagram illustrating a phantom frame 218 output by the port 300 to cause a collision with the transmitting station. The phantom frame 218 is an unrecognizable data frame that cannot be mistakenly interpreted as valid data. According to the disclosed embodiment, the phantom frame 218 is preferably a continuous stream of alternating ones and zeroes, as shown in FIG. 7A. The length of the phantom frame is preferably 568 bits long, which is less than the minimum sized frame, in order to be interpreted as a runt frame. Hence, the phantom frame has a length less than the prescribed minimum length for Ethernet data packets to ensure that the phantom frame is not erroneously interpreted as valid data. When the transmitting station 14 detects the transmission of the phantom frame 218 colliding with its own transmitted data frame packet, the transmitting station will abort transmission, jam, perform the TBEB algorithm, and attempt to retransmit the frame after waiting the appropriate random number of slot times specified by the TBEB algorithm. The multiport switch 12 will thus have the opportunity to clear some of its queues 67 during the time that the transmitting station is executing the TBEB algorithm.

Figure 7B:
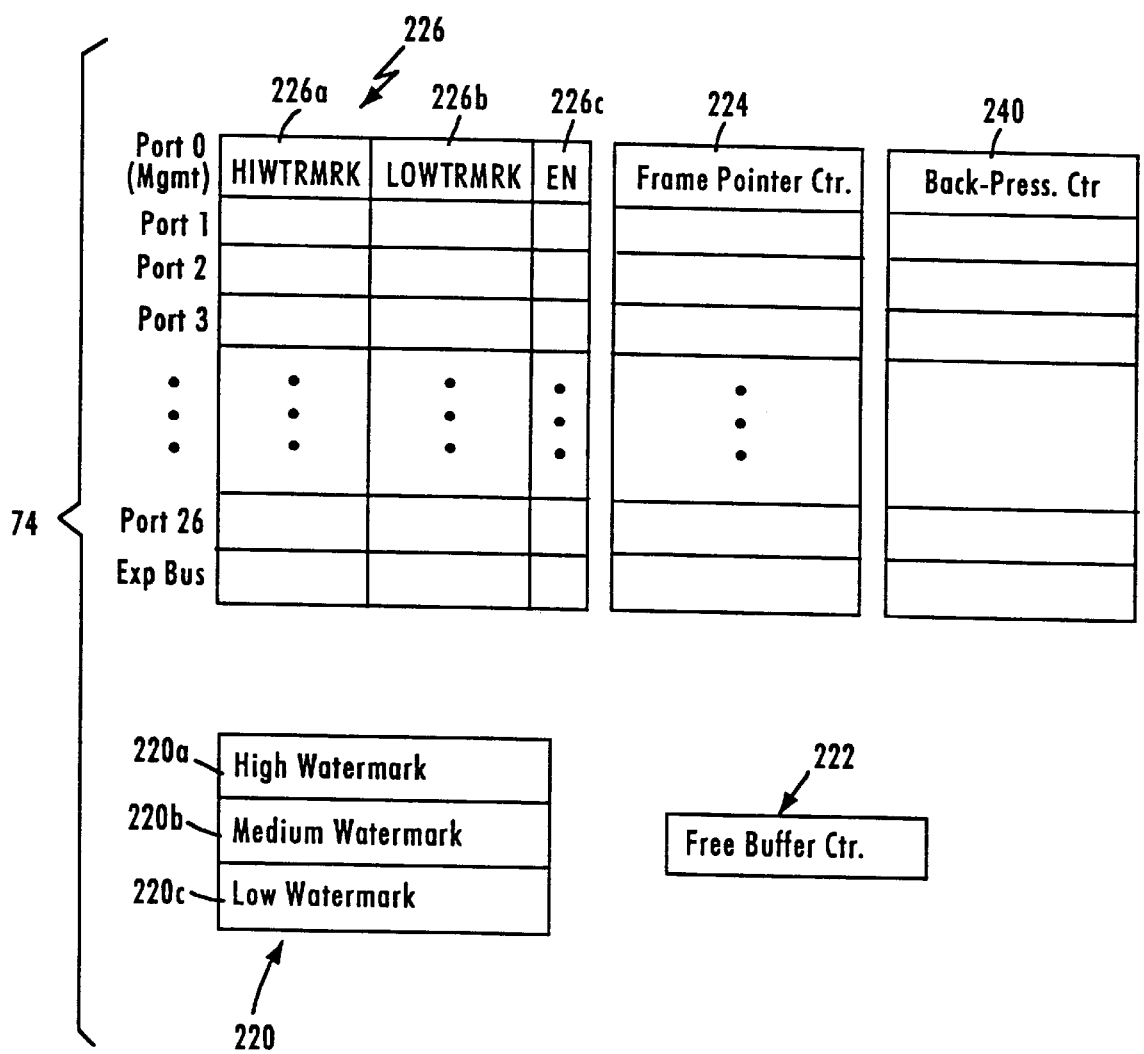

FIG. 7B is a diagram illustrating at least a portion of the control status registers 74 of FIG. 2 for adjusting threshold levels for flow control. According to the present invention, the registers of FIG. 7B are programmable by the host 40 to desired threshold values. Hence, the watermark thresholds 300 for the free buffer pool 104 and the port output queues 67 for each port are selectable by the host 40 in order to provide thresholds for flow control (e.g., back-pressure).

The free buffer pool 104 has three watermarks configured to store user-selectable thresholds. The registers 74 include registers 220a, 220b, and 220c for storing the high, medium, and low free buffer pool thresholds 300e, 300d, and 300c, respectively, and a free buffers available counter 222. The thresholds in registers 220 are compared to the free buffer available counter 222, which counts the number of currently available buffers (i.e., free frame pointers) in the free buffer pool 104.

The free buffers available counter 222 is decremented when a data packet is received by the multiport switch 12 on an incoming port 300, indicating that the number of currently available free frame pointers has been reduced by at least one in view of the received data packet. The frame pointer taken from the free buffer pool 104 is used to identify a storage location in the global frame buffer pool 134 for the received data frame. Since the received data packet may have a variable size, the counter 222 may be decremented a number of times depending on the size of the received packet. Conversely, the free buffers available counter 222 is incremented by at least one count each time a frame pointer is returned to the free buffer pool 104 after the corresponding data packet is output from the multiport switch 12, at which point the stored data packet can be cleared (e.g., overwritten) from the global frame buffer pool 134. Hence, the free buffer available counter 222 is initially set at a maximum prescribed value, and decrements as frame pointers are removed to fill the global frame buffer pool 134 with data packets. If the free buffers available counter 222 ever reaches zero, then the capacity of the global frame buffer pool 134 is exhausted, and data packets need to be dropped.

The registers 74 also include frame pointer counters 224 for each of the ports 67, 75, and 77. Each of the frame pointer counters 224 keep count of the total number of frame pointers in the corresponding output queue. Hence, the frame pointer counter value of zero means that the output queue for the corresponding output port is empty, where incrementing the frame pointer counter 224 indicates that the corresponding output queue is being filled with data (e.g., an assigned frame pointer). The frame pointer counter 224 counts the total number of frame pointers in the write-side queue 76, the read-side queue 78, and the corresponding overflow area 110 in the external memory 34. The counter increments when the port vector FIFO 63 writes a frame pointer to the output queue and decrements when the buffer manager 65 reads a frame pointer and transmits the frame.

The registers 74 also include programmable threshold registers 226 for the output queues 67 for the 10 Mb/s ports, the 100 Mb/s ports, the management port, and the expansion bus interface port. As shown in FIG. 7B, the registers include a high watermark register 226a (HIWTRMRK) for storing a high watermark threshold value 300b, and a low watermark register 226b (LOWTRMRK) that stores the low watermark threshold value 300a. The programmable registers 226 also include an enable register 226c used to enable the corresponding output port to generate the phantom frame to cause a collision. As will be recognized in the art, the enable register 226c may instead be implemented in separate port configuration registers.

The relationship between the watermark levels and the methodology of FIG. 6 will now be described with respect to FIG. 4. The free buffer pool 104 has three watermarks configured in the registers 220, namely high, medium, and low free buffer pool thresholds 300e, 300d, and 300c, and each output queue has a high watermark threshold 300b and a low watermark threshold 300a.

The method of FIG. 6 provides two conditions in which back-pressure is induced:

(1) if the output queue for port 302 is filled equal or above the high watermark 300b as indicated in step 210, and the destination port 302 is identified by the internal rules checker 68 within half a slot time of starting to receive the frame, then back-pressure will be asserted on the receiving port 300.

(2) if the output queue for port 302 is equal to or above the low watermark 300a, and the free buffer pool 104 is equal to or below the low watermark 300c, as indicated by steps 206 and 212 of FIG. 6, and the destination port 302 is identified by the internal rules checker 68 within half a slot time of starting to receive the frame (see step 214), then back-pressure will be asserted on port 300.

Figure 8A:
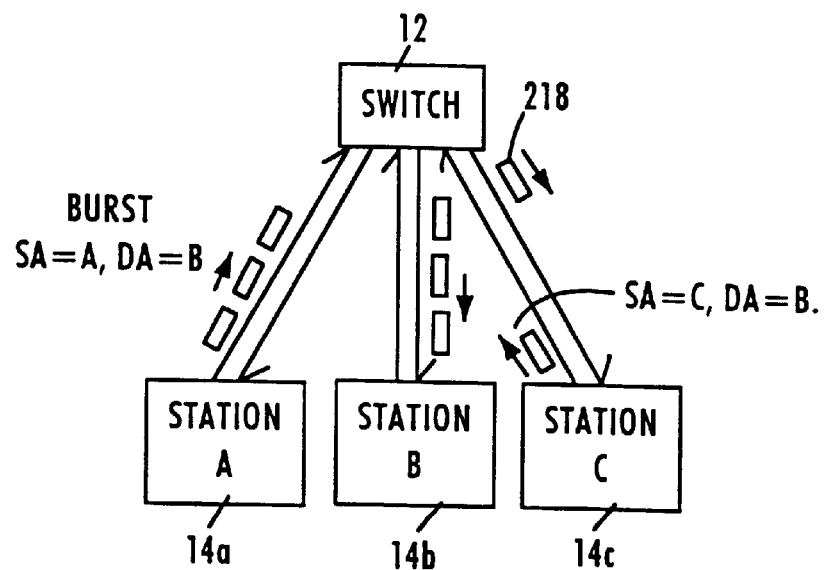
FIGS. 8A and 8B are diagrams illustrating transmission of data frames between contending network stations in accordance with an embodiment of the present invention.
Figure 8B:
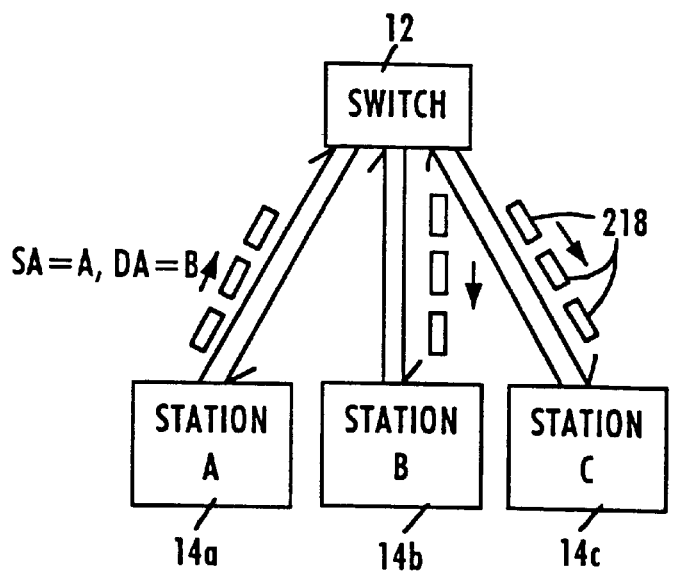

FIGS. 8A and 8B are diagrams illustrating transmission of data frames between contending network stations, where logical collisions domains are established to selectively control network traffic between contending stations. Specifically, assume in FIG. 8A that the multiport switch 12 is transferring packets received from station 14a to destination station 14b. At the same time, station 14c attempts to transmit a packet to station 14b, resulting in the generation of a phantom packet by the multiport switch 12. The phantom packet 218 causes a collision with station 14c, causing the station 14c to back-off according to the TBEB algorithm. As shown in FIG. 8A, station 14a is continuing to send data packets to station 14b via the switch 12, while station 14c is backed off.

The switch 12 enables the station 14c to contend for the busy output port of station 14b by temporarily connecting the three MAC layer ports together in a logical collision domain including the busy output port of station 14*b*, the busy receiving corresponding to station 14*a*, and the input report corresponding to station 14*c* that has deferred according to the TBEB algorithm. Once the output port switch 12 corresponding to station 14*b* becomes free, the other ports in the logical collision domain (corresponding to stations B and C) will detect that the carrier has become inactive, and will start their IPG counters. Accordingly, this arrangement allows ports that have been backed off to aggressively contend for an output port, even if the output port is being monopolized by a back-to-back burst transmission from another input port such as from station 14*a*.

For example, assuming that station 14*c* has backed off after attempting to transmit a data packet to station 14*b*, the destination address of the next data packet from station 14*c* will be known as attempting to transmit to station 14*b*. After station 14*c* receives the initial phantom packet 218 in FIG. 8A, the multiport switch 12 logically connects the receive carriers on the ports associated with stations 14*a* and 14*b* to the port corresponding to station 14*c*. Hence, the switch 12 maintains the burst between stations 14*a* and 14*b*, and outputs to station 14*c* a plurality of phantom frames 218 that mimic the carrier asserted on the ports serving the stations 14*a* and 14*b* during the burst from station 14*a*. At the same time, the number of phantom frames is monitored in a back-pressure counter 240 as shown in FIG. 7B. When the current packet activity from stations 14*a* to 14*b* ceases, both stations 14*a* and 14*c* will observe the deassertion of carrier activity, and both will start their IPG counters. Once station 14*c* has successfully transmitted to station 14*b*, then the counter 240 will be cleared, at which point the switch will tear down the logical collision domain.

The switch 12 maintains the number of times that a station 14*c* has been blocked in counter 240 to determine which port to prioritize in the event that two or more ports contend for a single output port. In the case of output port contention from two or more input ports, the port with the highest "throttle count" as identified in counter 240 will be allowed to transmit a data frame, while the other contending port will be controlled by generation of a phantom packet.

Figure 9:
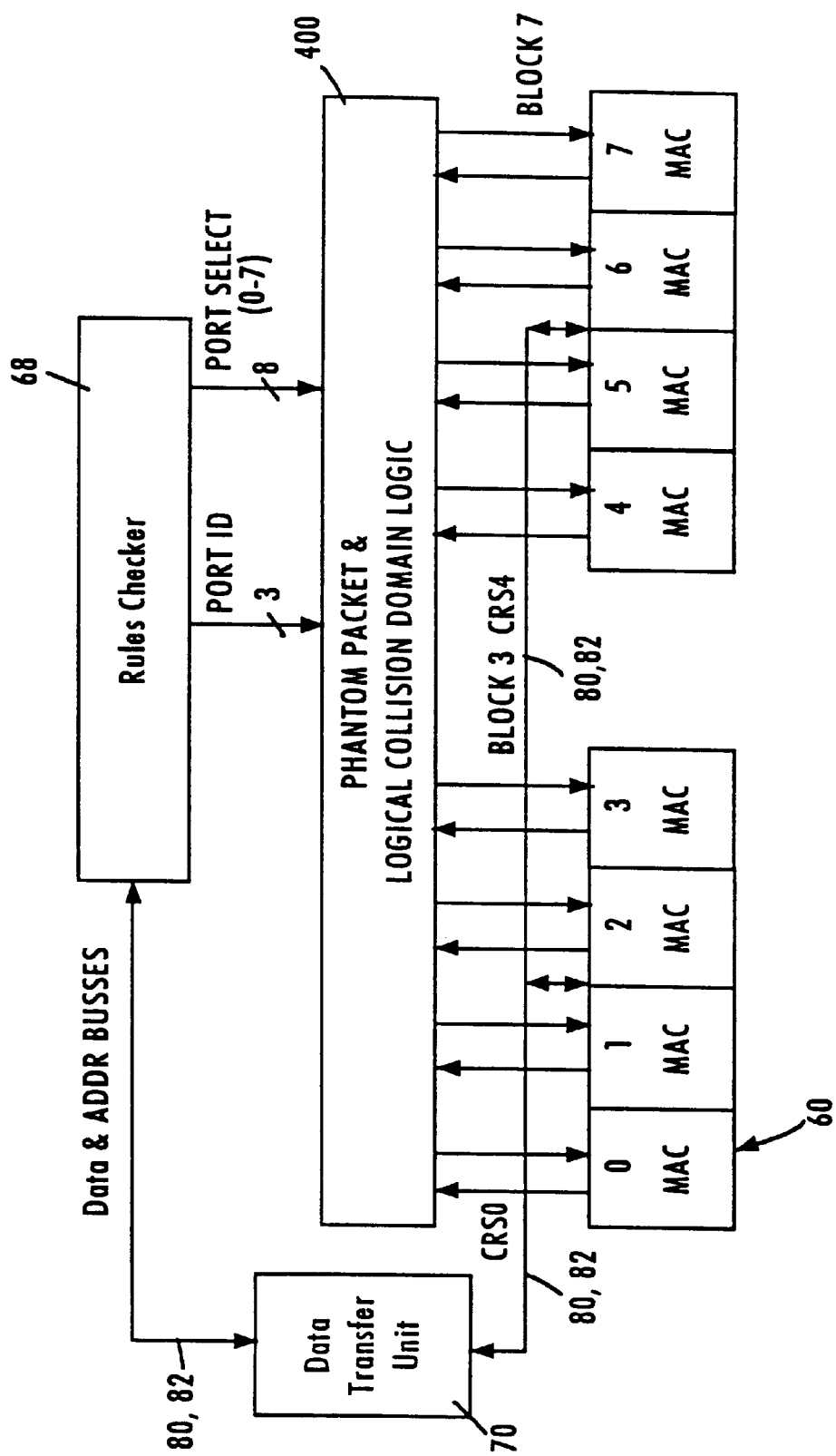
FIG. 9 is a diagram illustrating an apparatus within the multiport switch of FIG. 2 for establishing logical collision domains in accordance with an embodiment of the present invention.

FIG. 9 is a block diagram illustrating an apparatus for providing logical collision domain within the multiport switch 12. As shown in FIG. 9, the multiport switch 12 includes phantom packet and logical collision domain logic 400, connected to eight (8) MAC ports 60 for simplicity. Each MAC layer 60 provides a carrier sense signal (CRS) to the logical collision domain logic 400, and receive a block signal from the logical collision domain logic 400. The logical collision domain logic 400 detects an incoming packet from one of the MAC layers 60, and receives a port ID and port SELECT from the rules checker 68 identifying the destination of the packet from the input port. The logical collision domain logic 400 checks the output port threshold shown in FIG. 4 and determines whether a phantom packet has been initiated. If a phantom packet has been initiated, the phantom packet and logical collision domain logic 400 provides a virtual connection between the destination output port's carrier activity output and the back-off port's carrier detect input. Hence, if station 14*c* of FIG. 8B is connected to port 7 and stations 14*a* and 14*b* are connected to ports 0 and 1, respectively, the collision domain logic 400 will receive the carrier sense signals CRS0 and CRS1 from port 0 and port 1 of FIG. 9. The logical collision domain logic 400 in response will output a block signal to MAC 7, causing the MAC 7 to output the phantom frames 218 as shown in FIG. 8B.

According to the present invention, network traffic is selectively controlled by the multiport switch 12 to selectively generate flow control signals as needed depending on the available resources in a specific output port as well as shared global resources. It will be recognized that the 100 Mb/s ports may also be configured to operate in half-duplex mode and generate phantom frames, as described above. Moreover, it will be appreciated that different memory configurations can be applied, consistent with the use of frame pointers within the memory architecture to provide more efficient routing of data packets throughout the switch fabric.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method in a network having network stations, the method comprising:

setting a first queue threshold level for a first queue configured for storing free frame pointers, the free frame pointers specifying respective memory locations available for storing received data frames;

receiving a portion of a first data frame from a first of the network stations;

selectively transmitting a signal to the first network station during reception of the first data frame based on the first queue threshold level and a number of the free frame pointers stored in the first queue, the signal causing a collision with the first network stations during transmission of said first data frame;

setting a second queue threshold level for a port queue configured to store an assigned frame pointer, the assigned frame pointer specifying a storage memory location of a stored data frame to be transmitted to a second of the network stations;

identifying the port queue as a destination port for the first data frame based on the portion of the first data frame;

wherein the selectivity transmitting step comprises selectively generating the signal based on the number of free frame pointers relative to the first queue threshold level and a number of the assigned frame pointers relative to the second queue threshold level; and setting for the port queue a third queue threshold level having a value greater than the second queue threshold, the selectivity transmitting step further comprising selectivity generating the signal based on the number of assigned frame pointers relative to the third queue threshold level.

2. The method of claim 1, wherein the selectively transmitting step comprises transmitting the signal when the number of free frame pointers falls below the first queue threshold level.

3. The method of claim 1, wherein the selectively transmitting step further comprises selectively generating the signal if the number of free frame pointers falls below the first queue threshold level and the number of assigned frame pointers exceeds the second queue threshold level.

4. The method of claim 3, wherein the selectively transmitting step further comprises generating the signal to cause the collision if the number of assigned frame pointers exceeds the second queue threshold level and the third queue threshold level.

5. The method of claim 3, wherein the selectively transmitting step further comprises:

determining if the identifying step identifies the port queue within a prescribed time interval; and generating the signal if the identifying step identifies the port queue within the prescribed time interval, the number of free frame pointers falls below the first queue threshold, and the number of assigned frame pointers exceed the second queue threshold.

6. The method of claim 5, wherein the determining step comprises determining if the identifying step identifies the port queue within one half a slot time relative to receiving the portion of the first data frame.

7. The method of claim 1, wherein the selectively transmitting step comprises outputting as said signal an unrecognizable data frame to the first network station within one half a slot time of the reception of the portion of the first data frame.

8. The method of claim 7, wherein the outputting step comprises generating as said unrecognizable data frame a phantom packet having a length less than a minimum required data frame length.

9. The method of claim 8, wherein the phantom packet consists of a sequence of bits alternating between 1 and 0.

10. The method of claim 1, further comprising:

supplying data frames received from a second of the network stations to a third of the network stations during the collision with the first network station; and supplying carrier signals output by at least one of the second and third network stations to the first network station after the collision.

11. The method of claim 10, further comprising:

counting a number of collisions encountered by the first network station based on attempted transmissions of the first data frame; and selectively transmitting a second signal to one of the first network station, the second network station, and the third network station based on the counted number of collisions encountered by the first network station, the second signal causing a second collision with the one selected network station.

12. A method in a network switch for selectively outputting a data frame from a transmitting station to a destination station, comprising;

setting a first queue threshold level for a first queue configured for storing free frame pointers, the free frame pointers specifying respective memory locations available for storing received data frames;

setting a second queue threshold for a port queue configured for storing assigned frame pointers identifying stored data frames for the destination station;

receiving a portion of a first data frame from the transmitting station;

selectively halting transmission of the first data frame based on the first and second thresholds relative to a number of the stored free frame pointers and a number of the stored assigned frame pointers, respectively;

wherein the selectively halting step comprises outputting an unrecognizable data frame to the transmitting station within a prescribed interval of receiving the portion of the first data frame;

setting for the port queue a third queue threshold having a value greater than the second queue threshold, the selectivity halting step further comprising outputting the unrecognizable data frame based on at least one of;

the number of stored assigned frame pointers exceeding the second and third queue threshold, and the number of the stored free frame pointers falling below the first queue threshold level and the number of assigned frame pointers exceeding the second queue threshold.

13. The method of claim 12, further comprising identifying the port queue as a destination port for the first data frame based on the portion of the first data frame and within a prescribed interval of receiving the portion of the first data frame, the prescribed interval based on a distance between the network switch and the transmitting station.

14. An apparatus for selectively outputting a data frame from a transmitting station to a destination station in a network, comprising:

a first port for receiving at least a portion of the data frame from the transmitting station;

a first queue for storing free frame pointers, the free frame pointers specifying respective memory locations available for storing received data frames, a first programmable threshold register for storing a first threshold value;

a second port for outputting data frames identified for transmission to the destination station;

a controller for selectively causing the first output port to induce a collision with the transmitting station during reception of the data frame from the transmitting station, based on a number of the free frame pointers stored in the first queue relative to the first threshold value;

the second port comprises a second queue for storing assigned frame pointers specifying respective storage memory locations for the identified data frames;

the apparatus further comprises a second programmable threshold register storing a second threshold value;

the controller causes the first output port to induce the collision based on a number of the stored assigned frame pointers exceeding the second threshold value; and a third programmable threshold register storing a third threshold value greater than the second threshold value, the controller causing the first output port to induce the collision based on the number of stored assigned frame pointers exceeding the third threshold value and the number of free frame pointers falling below the first threshold value.

15. The apparatus of claim 14, further comprising a queue manager controlling the storage of the free frame pointers and the assigned frame pointers in the first queue and second queue, respectively, the first and second queue each comprising:

a write-side queue receiving the corresponding frame pointer at an input end and selectively outputting the corresponding frame pointer at an output end to a corresponding assigned portion of an external memory; and a read-side queue selectively receiving the corresponding frame pointer stored in the write-side queue from one of the output end of the write-side queue and the corresponding assigned portion of the external memory, the queue manager selectively storing the corresponding frame pointer in the assigned portion of the external memory based on a second number of the corresponding frame pointers stored in the read-side queue.

16. The apparatus of claim 15, wherein the number of free frame pointers stored in the first queue is based on the second number of free frame pointers stored in the corresponding read-side queue, a third number of the free frame pointers stored in the corresponding assigned portion of the external memory, and a fourth number of the free frame pointers stored in the corresponding write-side queue.

17. The apparatus of claim 15, wherein the number of assigned frame pointers stored in the first queue is based on the second number of assigned frame pointers stored in the corresponding read-side queue, a third number of the assigned frame pointers stored in the corresponding assigned portion of the external memory, and a fourth number of the assigned frame pointers stored in the corresponding write-side queue.

18. The apparatus of claim 15, wherein the queue manager fetches one of the stored received data frames from the external memory and supplies the fetched data frame to the second port based one of the assigned frame pointers output from the corresponding read-side queue.

* * * * *